(12) United States Patent
Kosakai et al.

(10) Patent No.: US 10,502,639 B2
(45) Date of Patent: Dec. 10, 2019

(54) PLATE-SHAPED BODY FOR TEMPERATURE MEASUREMENT AND TEMPERATURE MEASURING APPARATUS PROVIDED WITH THE SAME

(75) Inventors: Mamoru Kosakai, Tokyo (JP); Kazunori Ishimura, Tokyo (JP); Takeshi Watanabe, Tokyo (JP); Hitoshi Kouno, Tokyo (JP); Ryuuji Hayahara, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 194 days.

(21) Appl. No.: 14/239,352

(22) PCT Filed: Aug. 22, 2012

(86) PCT No.: PCT/JP2012/071165
§ 371 (c)(1),
(2), (4) Date: Feb. 18, 2014

(87) PCT Pub. No.: WO2013/031596
PCT Pub. Date: Mar. 7, 2013

(65) Prior Publication Data
US 2014/0204975 A1    Jul. 24, 2014

(30) Foreign Application Priority Data
Aug. 26, 2011    (JP) ................. 2011-185124

(51) Int. Cl.
*G01K 13/00*    (2006.01)
*H01L 21/67*    (2006.01)
(Continued)

(52) U.S. Cl.
CPC ........ *G01K 13/00* (2013.01); *H01L 21/67248* (2013.01); *H01L 22/12* (2013.01);
(Continued)

(58) Field of Classification Search
CPC .............. G01K 13/00; H01L 21/67248; H01L 2924/0002; H01L 21/6833; H05B 1/0233
See application file for complete search history.

(56) References Cited

U.S. PATENT DOCUMENTS 5,580,388 A * 12/1996 Moore ................ C23C 16/4404
118/500
5,740,016 A *  4/1998 Dhindsa .............. C23C 16/4586
165/11.1

(Continued)

FOREIGN PATENT DOCUMENTS

JP        1126563 A     1/1999
JP     2000-260683 A    9/2000
(Continued)

OTHER PUBLICATIONS

Translation of JP 2004228334.*
(Continued)

*Primary Examiner* — Lisa M Caputo
*Assistant Examiner* — Tran M. Tran
(74) *Attorney, Agent, or Firm* — Merchant & Gould P.C.

(57) ABSTRACT

A plate-shaped body for temperature measurement which, simply by being mounted on a mounting surface of an electrostatic chuck apparatus and without using a semiconductor wafer itself, is able to easily optimize the in-plane temperature distribution of the mounting surface of the electrostatic chuck apparatus, the temperature rising characteristics, and the cooling characteristics during decreases in temperature. In such plate-shaped body for temperature measurement (1), an insulating adhesive (3) is bonded to the entirety of a surface (2*a*) of a wafer (2), a heater element (4) is provided on the insulating adhesive (3), a temperature measurement region (5) is provided used to measure the temperature of the surface (2*a*) of the wafer (2) in a region excluding the heater element (4) on the surface (3*a*) of the (Continued)

insulating adhesive (3), and the heater element (4) and the temperature measurement region (5) are coated with an insulating film (6).

12 Claims, 3 Drawing Sheets

(51) Int. Cl.
　　　*H05B 3/26* 　　　(2006.01)
　　　*H05B 1/02* 　　　(2006.01)
　　　*H01L 21/66* 　　　(2006.01)
　　　*H01L 21/683* 　　(2006.01)
(52) U.S. Cl.
　　　CPC .......... *H05B 1/0233* (2013.01); *H05B 3/265* (2013.01); *H01L 21/6833* (2013.01); *H01L 2924/0002* (2013.01); *H05B 2203/002* (2013.01)

(56) References Cited

U.S. PATENT DOCUMENTS

| | | | | |
|---|---|---|---|---|
| 5,851,641 | A * | 12/1998 | Matsunaga | H01L 21/6833 204/298.01 |
| 6,071,630 | A * | 6/2000 | Tomaru | B23Q 3/154 279/128 |
| 6,100,506 | A * | 8/2000 | Colelli, Jr. | H01L 21/67248 118/725 |
| 6,222,161 | B1 * | 4/2001 | Shirakawa | H01L 21/67109 118/725 |
| 6,242,719 | B1 * | 6/2001 | Kano | H01L 21/67103 219/444.1 |
| 6,256,187 | B1 * | 7/2001 | Matsunaga | B23Q 3/00 279/128 |
| 6,410,172 | B1 * | 6/2002 | Gilbert, Sr. | C23C 16/0272 219/444.1 |
| 6,448,575 | B1 * | 9/2002 | Slocum | H01L 23/34 257/48 |
| 6,452,137 | B1 * | 9/2002 | Kariya | H05B 3/12 219/544 |
| 6,465,763 | B1 * | 10/2002 | Ito | H01L 21/67103 118/725 |
| 6,475,606 | B2 * | 11/2002 | Niwa | C04B 41/009 219/538 |
| 6,556,414 | B2 * | 4/2003 | Kosakai | B25B 11/005 361/234 |
| 6,664,515 | B2 * | 12/2003 | Natsuhara | H01L 21/67103 219/444.1 |
| 6,677,557 | B2 * | 1/2004 | Ito | H01L 21/67103 219/444.1 |
| 6,740,853 | B1 * | 5/2004 | Johnson | C23C 16/4586 118/620 |
| 6,753,508 | B2 * | 6/2004 | Shirakawa | H01L 21/67109 219/390 |
| 6,853,533 | B2 * | 2/2005 | Parkhe | H01L 21/67248 361/234 |
| 6,872,908 | B2 * | 3/2005 | Ootsuka | B32B 18/00 219/121.52 |
| 6,887,316 | B2 * | 5/2005 | Hiramatsu | H01L 21/67103 118/715 |
| 6,917,021 | B2 * | 7/2005 | Kano | H01L 21/67103 219/444.1 |
| 6,950,297 | B2 * | 9/2005 | Kosakai | H02N 13/00 361/234 |
| 6,967,312 | B2 * | 11/2005 | Hiramatsu | H01L 21/67103 219/444.1 |
| 6,977,804 | B2 * | 12/2005 | Yanagida | H01L 21/6831 361/234 |
| 6,979,805 | B2 * | 12/2005 | Arthur | B01J 7/00 219/538 |
| 7,075,031 | B2 * | 7/2006 | Strang | H01J 37/32724 |
| 7,078,655 | B1 * | 7/2006 | Ito | C04B 35/00 219/444.1 |
| 7,206,184 | B2 * | 4/2007 | Ennis | H01J 37/32165 361/230 |
| 7,417,206 | B2 * | 8/2008 | Nakamura | H01L 21/67103 219/444.1 |
| 7,568,399 | B2 * | 8/2009 | Sparks | G01F 1/8445 73/204.26 |
| 7,619,870 | B2 * | 11/2009 | Himori | H01L 21/6833 361/230 |
| 7,621,180 | B2 * | 11/2009 | Sakuma | G01F 1/688 73/204.26 |
| 7,646,581 | B2 * | 1/2010 | Sasaki | C23C 14/505 361/234 |
| 7,673,508 | B2 * | 3/2010 | Sakuma | G01F 1/6845 73/204.26 |
| 7,705,275 | B2 * | 4/2010 | Umotoy | C23C 16/45521 156/345.48 |
| 7,739,908 | B2 * | 6/2010 | Wienand | G01F 1/6845 73/204.26 |
| 7,741,584 | B2 * | 6/2010 | Mariner | H05B 3/24 219/444.1 |
| 7,962,016 | B2 * | 6/2011 | Choe | C23C 14/243 118/726 |
| 8,143,557 | B2 * | 3/2012 | Shibata | H01L 21/67103 219/444.1 |
| 8,168,050 | B2 * | 5/2012 | Lu | H05B 3/143 118/715 |
| 8,186,213 | B2 * | 5/2012 | Nakano | G01F 1/692 73/204.26 |
| 8,226,769 | B2 * | 7/2012 | Matyushkin | H01L 21/67109 118/725 |
| 8,247,080 | B2 * | 8/2012 | Iacovangelo | C04B 41/009 118/720 |
| 8,359,919 | B2 * | 1/2013 | Matsumoto | G01N 27/18 73/204.26 |
| 8,663,391 | B2 * | 3/2014 | Matyushkin | H01L 21/67109 118/724 |
| 8,779,337 | B2 * | 7/2014 | Nakano | G01F 1/684 219/483 |
| 8,823,404 | B2 * | 9/2014 | Sasaki | H01L 21/67248 250/442.11 |
| 8,883,564 | B2 * | 11/2014 | Hirotsuru | C04B 41/009 257/99 |
| 8,888,917 | B2 * | 11/2014 | Emerson | C23C 16/46 118/725 |
| 8,927,906 | B2 * | 1/2015 | Tadokoro | B05C 21/00 219/220 |
| 8,981,263 | B2 * | 3/2015 | Sasaki | H01L 21/6831 118/725 |
| 9,209,061 | B2 * | 12/2015 | Hayahara | H01L 21/67109 |
| 9,275,887 | B2 * | 3/2016 | Matyushkin | H01L 21/67109 |
| 9,330,953 | B2 * | 5/2016 | Miura | H01L 21/6831 |
| 9,343,346 | B2 * | 5/2016 | Kosakai | H01L 21/67103 |
| 2003/0015521 | A1 * | 1/2003 | Ito | H05B 3/143 219/544 |
| 2005/0045618 | A1 * | 3/2005 | Ito | B32B 18/00 219/444.1 |
| 2005/0095776 | A1 * | 5/2005 | Usuami | H01L 21/67109 438/232 |
| 2010/0089146 | A1 * | 4/2010 | Morita | G01F 1/6842 73/204.26 |

FOREIGN PATENT DOCUMENTS

| | | |
|---|---|---|
| JP | 2002203663 A | 7/2002 |
| JP | 2003203663 A | 7/2003 |
| JP | 2004-228334 A | 8/2004 |
| JP | 2004296553 A | 10/2004 |
| JP | 3663035 B | 6/2005 |

OTHER PUBLICATIONS

Japanese Patent Office, Notice of Reasons for Rejection issued in corresponding Japanese Patent Application No. 2011-185124 and English-language translation dated Feb. 3, 2015.

(56) References Cited

OTHER PUBLICATIONS

Japanese Patent Office, International Search Report issued in Application No. PCT/JP2012/071165, dated Sep. 25, 2012, 4 pp.
Japanese Patent Office, Notice of Reasons for Rejection issued in corresponding Japanese Patent Application No. 2011-185124 and English-language translation dated Jul. 21, 2015.

* cited by examiner

PLATE-SHAPED BODY FOR TEMPERATURE MEASUREMENT AND TEMPERATURE MEASURING APPARATUS PROVIDED WITH THE SAME

TECHNICAL FIELD

The present invention relates to a plate-shaped body for temperature measurement and a temperature measuring apparatus provided with the same, more specifically, to a plate-shaped body for temperature measurement which is able to easily and in real time evaluate the in-plane temperature distribution of a mounting surface of an electrostatic chuck apparatus which is mounted with a plate-shaped sample such as a semiconductor wafer in a semiconductor manufacturing process, the temperature rising characteristics, and the cooling characteristics during decreases in temperature, and to a temperature measuring apparatus provided with the same.

The present application claims priority on the basis of Japanese Patent Application No. 2011-185124 filed in Japan on 26 Aug. 2011, which is incorporated herein by reference.

BACKGROUND ART

In recent years, along with increased performance and increased integration of elements in semiconductor manufacturing processes, there has been a demand for further improvements in fine processing techniques. The etching technique is an important fine processing technique within the semiconductor manufacturing processes and plasma etching techniques which are able to finely process a large area with high efficiency have become mainstream etching techniques in recent years.

In semiconductor manufacturing apparatuses which use plasma such as plasma etching apparatuses, electrostatic chuck apparatuses have been used for some time as apparatuses where wafers are easily attached and fixed to a sample stage and the wafers are maintained at a predetermined temperature.

Here, in the electrostatic chuck apparatuses of the related art, when the plate-shaped sample such as a semiconductor wafer which is the product actually moves along the semiconductor manufacturing line, there is a need to adjust the in-plane temperature distribution of the mounting surface of the electrostatic chuck apparatus in the semiconductor manufacturing line, the temperature rising characteristics, and the cooling characteristics during decreases in temperature to be within a range of optimum values in advance, thus, a wafer with an attached temperature sensor where hot junctions of a thermocouple are each attached and fixed with heat-resistant cement to a plurality of recess sections which dot the surface of the wafer is proposed (PTL 1).

In a case where the manufacturing conditions of an electrostatic chuck apparatus are optimized in a semiconductor manufacturing line using the wafer with the attached temperature sensor, a method has been adopted where the wafer with the attached temperature sensor is mounted on a mounting surface of the electrostatic chuck apparatus and the temperature of the wafer is measured in real time by the temperature sensor while the electrostatic chuck apparatus where the wafer with the attached temperature sensor is mounted moves along the semiconductor manufacturing line.

CITATION LIST

Patent Literature

[PTL 1] Japanese Patent No. 3663035

SUMMARY OF INVENTION

Technical Problem

Here, in order to optimize the manufacturing conditions of the electrostatic chuck apparatus for the wafer with the attached temperature sensor of the related art described above, a method is adopted where the manufacturing conditions are optimized on the basis of the result after actually moving the wafer with the attached temperature sensor along the semiconductor manufacturing line. Accordingly, there is a problem in that the wafer with the attached temperature sensor itself is consumed in order to optimize the conditions of the electrostatic chuck apparatus.

In addition, there is a need to perform heating of the wafer with the attached temperature sensor using a heater which is installed in the electrostatic chuck apparatus or using plasma radiation of the semiconductor apparatus or an external heater, whereby there are problems in that the process of optimizing the in-plane temperature distribution of the mounting surface of the electrostatic chuck apparatus, the temperature rising characteristics, and the cooling characteristics during decreases in temperature are complicated, and that the optimizing takes time.

In addition, even in a case where the wafer with the attached temperature sensor is used without actually moving the wafer along the semiconductor manufacturing apparatus, there is a need to perform heating of the wafer with the attached temperature sensor using an external heater, whereby there are similar problems in that the process of optimizing the in-plane temperature distribution of the mounting surface of the electrostatic chuck apparatus, the temperature rising characteristics, and the cooling characteristics during decreases in temperature are complicated, and that the optimizing takes time.

The present invention was created in consideration of the circumstances described above, and has an object of providing a plate-shaped body for temperature measurement which, simply by being mounted on a mounting surface of an electrostatic chuck apparatus, is able to easily optimize the in-plane temperature distribution of the mounting surface of the electrostatic chuck apparatus, the temperature rising characteristics, and the cooling characteristics during decreases in temperature without using a semiconductor wafer itself which is a product, and a temperature measuring apparatus provided with the same.

Solution to Problem

As a result of intensive studies in order to solve the problems described above, the present inventors found that when a heating member is provided on one main surface of a plate-shaped body which is mounted on a mounting surface of an electrostatic chuck apparatus and a temperature measurement region is provided to measure the temperature of the plate-shaped body in a region excluding the heating member on the main surface, it is possible to measure the actual temperature of the temperature measurement region, that is, the actual surface temperature of the plate-shaped body in real time using a non-contact type temperature measuring apparatus such as a thermograph, an optical thermometer, or a radiation thermometer, or using a contact type temperature measuring apparatus such as a thermocouple, and that accordingly easy and real time evaluation is possible of the in-plane temperature distribution of a mounting surface of an electrostatic chuck apparatus, the temperature rising characteristics, and the cooling characteristics during decreases in temperature, thereby completing the present invention.

That is, according to an aspect of the invention, there is provided a plate-shaped body for temperature measurement, in which a heating member is provided on one main surface of a plate-shaped body and a temperature measurement region used to measure the temperature of the plate-shaped body is provided in a part of a region excluding the heating member on the one main surface.

In the plate-shaped body for temperature measurement, it is possible to measure the actual temperature of the temperature measurement region in real time using a non-contact type temperature measuring apparatus such as a thermograph, an optical thermometer, or a radiation thermometer by heating using the heating member which is provided in the plate-shaped body for temperature measurement in a state where the plate-shaped body for temperature measurement is mounted on the mounting surface of the electrostatic chuck apparatus. Due to this, it is possible to measure the actual surface temperature in real time in the temperature measurement region of the plate-shaped body and it is possible to easily evaluate in real time the in-plane temperature distribution of the mounting surface of the electrostatic chuck apparatus, the temperature rising characteristics, and the cooling characteristics during decreases in temperature, based on the measured values.

In the plate-shaped body for temperature measurement of the present invention, the heating member is a metal foil and the metal foil is attached to the one main surface via an insulating adhesive.

In the plate-shaped body for temperature measurement, the heat transfer rate between the heating member and the plate-shaped body is made constant by forming the heating member of a metal foil and attaching the metal foil to the one main surface via an insulating adhesive.

In the plate-shaped body for temperature measurement of the present invention, the plate-shaped body is formed of any one type of silicon, silicon carbide, silicon nitride, III-V group compound semiconductors, or II-VI group compound semiconductors.

In the plate-shaped body for temperature measurement of the present invention, by forming the plate-shaped body from anyone type of silicon, silicon carbide, silicon nitride, III-V group compound semiconductors, or II-VI group compound semiconductors, it is possible to obtain an evaluation of the mounting surface of the electrostatic chuck apparatus similar to a case of using a semiconductor wafer which is a product.

In the plate-shaped body for temperature measurement of the present invention, the heating member is coated with an insulating film.

In the plate-shaped body for temperature measurement, since the heating member is coated with an insulating film, the insulation of the heating member is favorably maintained, and it is possible to measure the temperature using a thermograph.

In the plate-shaped body for temperature measurement of the present invention, the insulating adhesive includes at least one type of acrylic-based adhesive, epoxy-based adhesive, or polyimide amide-based adhesive.

In the plate-shaped body for temperature measurement, by the insulating adhesive including any one type of acrylic-based adhesive, epoxy-based adhesive, or polyimide amide-based adhesive, stress between the plate-shaped body and the heating member is relieved and concerns about the problem of the heating member peeling off from the plate-shaped body are eliminated.

In the plate-shaped body for temperature measurement of the present invention, thermocouples are connected to the temperature measurement region.

In the plate-shaped body for temperature measurement, by connecting the thermocouple to the temperature measurement region, it is possible to directly measure the actual temperature of the temperature measurement region in real time using a thermocouple. Due to this, it is possible to accurately measure the actual surface temperature in real time in the temperature measurement region of the plate-shaped body.

A temperature measuring apparatus of the present invention includes the plate-shaped body for temperature measurement of the present invention.

By providing the plate-shaped body for temperature measurement of the present invention in the temperature measuring apparatus, it is possible to perform evaluation easily and in real time of the in-plane temperature distribution of a mounting surface of an electrostatic chuck apparatus, the temperature rising characteristics, and the cooling characteristics during decreases in temperature.

Advantageous Effects of Invention

According to the plate-shaped body for temperature measurement of the present invention, since a heating member is provided on one main surface of the plate-shaped body and a temperature measurement region used to measure the temperature of the plate-shaped body is provided in a region excluding the heating member on the one main surface, by heating the plate-shaped body for temperature measurement using the heating member which is installed therein in a state where the plate-shaped body for temperature measurement is mounted on the mounting surface of the electrostatic chuck apparatus, it is possible to measure the actual temperature of the temperature measurement region in real time using a non-contact temperature measuring apparatus such as a thermograph, an optical thermometer, or a radiation thermometer. Accordingly, it is possible to measure the actual surface temperature of the temperature measurement region in real time, and it is possible to perform evaluation easily and in real time of the in-plane temperature distribution of the mounting surface of the electrostatic chuck apparatus, the temperature rising characteristics, and the cooling characteristics during decreases in temperature based on the measurement values.

According to the temperature measuring apparatus of the present invention, since the plate-shaped body for temperature measurement of the present invention is provided, it is possible to perform evaluation easily and in real time of the in-plane temperature distribution of the mounting surface of the electrostatic chuck apparatus, the temperature rising characteristics, and the cooling characteristics during decreases in temperature using the plate-shaped body for temperature measurement.

DESCRIPTION OF EMBODIMENTS

Hereinafter, a description will be provided of embodiments which use the plate-shaped body for temperature measurement of the present invention and the temperature measuring apparatus provided therewith based on the drawings.

Here, aspects will be specifically described in order to facilitate a better understanding of the gist of the invention; however, the present invention is not limited thereto unless otherwise specified.

[First Embodiment]

Figure 1:
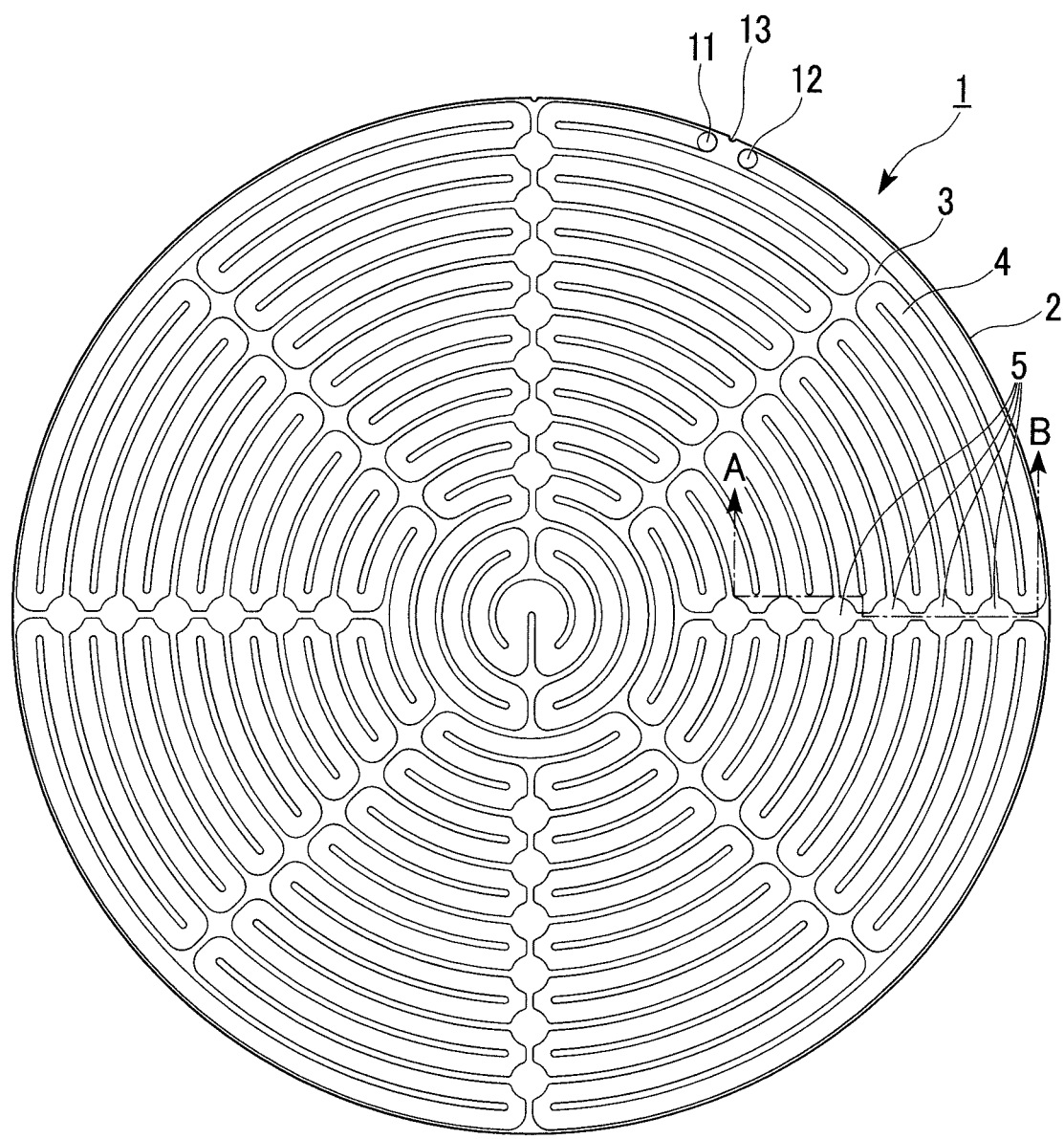
FIG. 1 is a planar view which shows a plate-shaped body for temperature measurement of a first embodiment of the present invention.
Figure 2:
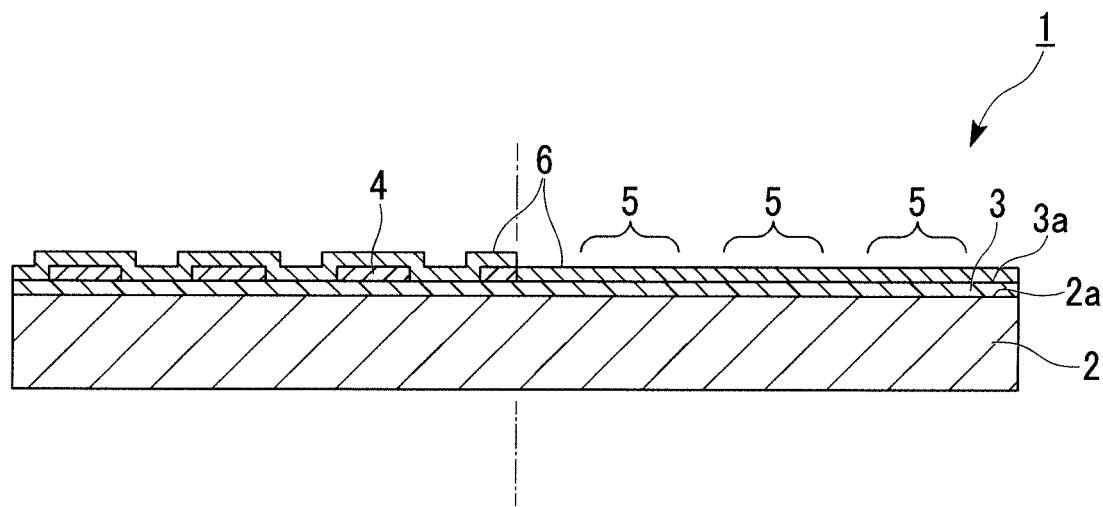
FIG. 2 is a cross-sectional view taken along the line A-B in FIG. 1.

FIG. 1 is a planar view which shows a wafer for temperature measurement (plate-shaped body for temperature measurement) of the first embodiment of the present invention and FIG. 2 is a cross-sectional view taken along the line A-B in FIG. 1.

In this wafer for temperature measurement 1, an insulating adhesive 3 is bonded to the entire surface of a surface (one main surface) 2a of a wafer (a plate-shaped body) 2, and a heater element (heating member) 4 which has a predetermined pattern with a substantially meandering shape is provided on the insulating adhesive 3. Then, a temperature measurement region 5 with a substantially circular shape used to measure the temperature of the surface 2a of the wafer 2 is provided at a predetermined location (a part) in a region excluding the heater element 4 on a surface 3a of the insulating adhesive 3.

The heater element 4 and the temperature measurement region 5 are coated with an insulating film 6 with an infrared transmittance of 80% or less. Here, voltage application electrodes 11 and 12 are voltage application electrodes which are provided at opposite ends of the heater element 4, and a notch 13 is a notch for positionally aligning the wafer 2.

The wafer 2 is a plate-shaped sample such as a semiconductor wafer which is a product and it is preferable to use a plate-shaped sample which moves along the actual semiconductor manufacturing line as it is.

Examples of the wafer 2 include silicon wafers, SiC (silicon carbide) wafers, $Si_3N_4$ (silicon nitride) wafers, III-V group compound semiconductor wafers such as GaAs and GaAsN, II-VI group compound semiconductor wafers such as ZnSe and the like, which are appropriately selected and used in combination with the semiconductor wafer which is a product.

The size and shape of the wafer 2 are not particularly limited as long as they are appropriately selected to match the electrostatic chuck apparatus where the wafer for temperature measurement 1 is mounted.

The insulating adhesive 3 is an adhesive with a sheet shape or a film shape which has heat resistance and an insulating property, and is an adhesive where any one of an acrylic-based adhesive, an epoxy-based adhesive, or a polyimide amide-based adhesive is set as a main component.

The thickness of the insulating adhesive 3 is preferably 5 µm or more and 100 µm or less, and more preferably 15 µm or more and 50 µm or less. Variations in the in-plane thickness of the insulating adhesive 3 are preferably within 10% thereof.

Here, when the variations in the in-plane thickness of the insulating adhesive 3 exceed 10%, variations which exceed 10% of the in-plane thickness of the insulating adhesive 3 occur in the in-plane interval between the wafer 2 and the heater element 4 and the in-plane uniformity of heat which is transferred from the heater element 4 to the wafer 2 is decreased. As a result, the in-plane temperature of the surface 2a of the wafer 2 is uneven and it is not possible to optimize the in-plane temperature distribution of the mounting surface of the electrostatic chuck apparatus, the temperature rising characteristics, and the cooling characteristics during decreases in temperature, which is not preferable.

The heater element 4 generates heat due to the application of a predetermined voltage to the power application electrodes 11 and 12 and is formed of a non-magnetic metal foil which has a predetermined pattern.

Here, eight element parts which are set to an overall fan shape are arrayed around a central axis by a single meandering metal thin wire, whereby a single heater element 4 is set by connecting these. Here, the pattern of the heater element 4 in FIG. 1 is shown as an example, but it is possible to appropriately change the pattern to match the processes or the application of the semiconductor wafer which is the target.

The heater element 4 is formed of a non-magnetic metal foil with a high melting point made of, for example, titanium (Ti), tungsten (W), tantalum (Ta), or molybdenum (Mo) with a fixed thickness of 300 µm or less, and preferably 100 µm or less, by using a photolithography method, and is then formed into a desired heater pattern using an etching processing.

Here, the reason for setting the thickness of the heater element 4 to 300 µm or less is that, when the thickness exceeds 300 µm, variation in the precision of the etching process is increased since the line width of the heater element is made thinner and, as a result, the temperature distribution of the surface of the wafer 2 changes and it is not possible to accurately measure the temperature distribution of the surface of the wafer 2.

In addition, when the heater element 4 is formed of a non-magnetic metal foil, even when the wafer for temperature measurement 1 is used in a high frequency atmosphere, the heater element does not heat itself due to the high frequency, whereby it is easy to maintain the in-plane temperature of the wafer for temperature measurement 1, which is preferable.

The temperature measurement region 5 is a region with a substantially circular shape with a diameter of 2 mm to 15 mm and it is possible to measure the temperature of the temperature measurement region 5 in real time using a non-contact type temperature measuring apparatus such as a thermograph, an optical thermometer, or a radiation thermometer.

The position where the temperature measurement region 5 is formed is selected so as to accurately represent the in-plane temperature distribution of the wafer 2 in order to accurately ascertain the in-plane temperature distribution of the mounting surface of the electrostatic chuck apparatus where the wafer for temperature measurement 1 is mounted, the temperature rising characteristics, and the cooling characteristics during decreases in temperature. Here, each of the temperature measurement regions 5, which are dotted in a cross shape on the surface of the wafer 2, is arrayed in one row at predetermined intervals from each other.

Since the insulating film 6 is provided such that it is possible to measure the temperatures of the temperature measurement regions 5 using a thermograph, the insulating film 6 is configured using Teflon (registered trademark), polyimide, polyamide, or the like with a sheet shape or a film shape having heat resistance and an insulating property and which is able to be measured using a thermograph. It is sufficient if the insulating film 6 is a film where it is possible to measure the infrared transmittance using a thermograph, and it is preferable that the infrared transmittance in such a case be 80% or less.

By using this insulating film 6, it is possible to prevent the temperature of the thermograph itself from influencing the measurement values due to reflection from the thermograph during the measurement using the thermograph. In addition, in the temperature measurement using the thermograph, the measurement results of the temperature change according to the radiation rate of the object to be measured; however, it is possible to set the heater element 4, the insulating adhesive 3, and the like to the same radiation rate by using the insulating film 6, whereby the measurement precision of the temperature is improved.

Here, the insulating film 6 covers the heater element 4 and the entire temperature measurement region 5; however, the insulating film 6 may be configured to cover only the temperature measurement region 5 in consideration of measuring the temperature of the temperature measurement region 5 using a thermograph.

Next, a description will be given of a method of manufacturing the wafer for temperature measurement 1.

First, the wafer 2 which is moved along the target semiconductor manufacturing line is selected from plate-shaped samples of semiconductor wafers or the like which are the products.

Next, the insulating adhesive 3, which is an adhesive with a sheet shape or a film shape is bonded on the wafer 2.

Next, a non-magnetic metal foil made of a material, such as titanium (Ti), tungsten (W), tantalum (Ta), or molybdenum (Mo), is bonded and attached onto the insulating adhesive 3, and etching processing is performed with a desired heater pattern using a photolithography method to set the heater element 4. The temperature measurement regions 5 are also formed at the same time during the etching processing.

Next, the insulating film 6 is formed so as to cover the heater element 4 and all of the temperature measurement regions 5. In a case where measurement with a thermograph is considered, it is possible to form the insulating film 6 using Teflon (registered trademark), polyimide, polyamide, or the like with a sheet shape or a film shape having heat resistance and an insulating property in order to prevent reflection of infrared rays from the thermograph itself, the outer wall of the chamber, or the like.

Due to this, it is possible to produce a wafer for temperature measurement 1.

Figure 3:
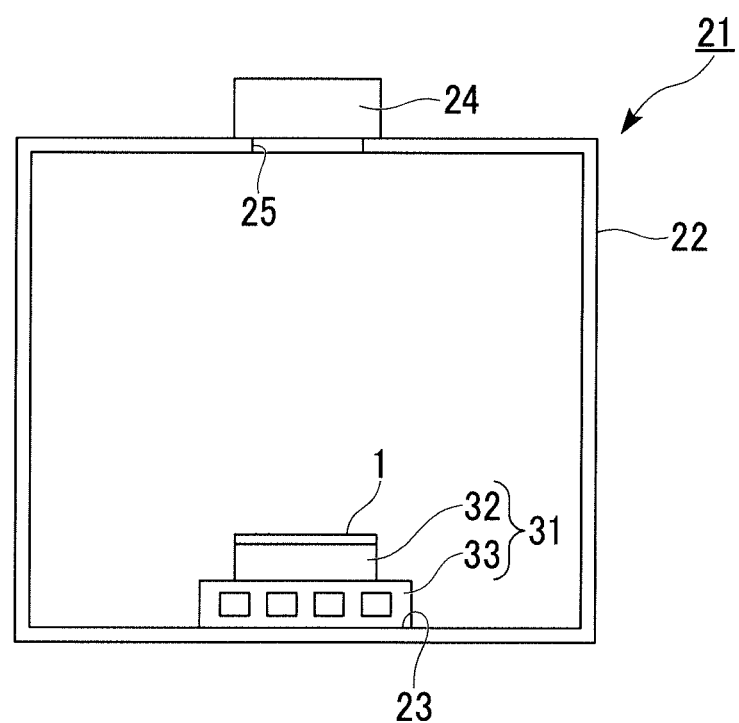
FIG. 3 is a schematic view which shows a temperature measuring apparatus which is provided with the plate-shaped body for temperature measurement of the first embodiment of the present invention.

FIG. 3 is a schematic diagram which shows a temperature measuring apparatus 21 which is provided with the wafer for temperature measurement 1 of the present embodiment. The temperature measuring apparatus 21 has a space 23 which stores an electrostatic chuck apparatus 31 which is mounted with the wafer for temperature measurement 1 in a bottom section of a sealed container 22 where it is possible to adjust the type of atmosphere, the temperature, the humidity, the pressure, and the like, a thermograph 24 which is able to measure the surface temperature by contact is provided outside the ceiling plate of the sealed container 22 which faces the space 23, and the thermograph 24 is set to be able to measure the surface temperature of the electrostatic chuck apparatus 31 which is stored inside the space 23 via a window 25 which is formed in the ceiling plate.

Description will be given of a method of measuring various characteristics such as the in-plane temperature distribution of the mounting surface of the electrostatic chuck apparatus, the temperature rising characteristics, and the cooling characteristics during decreases in temperature using the temperature measuring apparatus 21.

First, the wafer for temperature measurement 1 of the present embodiment is mounted on the mounting surface of the electrostatic chuck apparatus 31.

The electrostatic chuck apparatus 31 is provided with an electrostatic chuck section 32 with a circular plate shape, and a cooling base section 33 with a circular plate shape with a thickness which cools the electrostatic chuck section 32 to the desired temperature.

A heater used to heart a plate-shaped sample such as a silicon wafer may be installed in the electrostatic chuck section 32.

Next, the electrostatic chuck apparatus 31 which is mounted with the wafer for temperature measurement 1 is arranged over the space 23 of the bottom section of the sealed container 22, and the atmosphere, temperature, pressure, and the like inside the sealed container 22 are adjusted.

For example, adjustments are made to a vacuum atmosphere with a temperature of 60° C. Here, the atmosphere, the temperature, the pressure, and the like may be adjusted by introducing a desired gas inside the sealed container 22.

Next, while measuring the temperature of a plurality of temperature measurement regions 5 of the wafer for temperature measurement 1 in real time using the thermograph 24, a voltage is applied to the heater element 4 of the wafer for temperature measurement 1 and the wafer for temperature measurement 1 is heated up to the target wafer temperature to be reached in the semiconductor manufacturing process.

As a result of the measurement using the thermograph 24, the temperature rising characteristics of the wafer 2 in the wafer for temperature measurement 1 are understood. Accordingly, it is possible to evaluate the temperature rising characteristics in the mounting surface of the electrostatic chuck apparatus 31 easily and in real time.

The temperature of a plurality of temperature measurement regions 5 of the wafer for temperature measurement 1 are measured in order in real time using the thermograph 24 at the timing when the temperature of the wafer for temperature measurement 1 is stabilized at the target wafer temperature.

As a result of the measurement using the thermograph 24, the in-plane distribution of the wafer 2 in the wafer for temperature measurement 1 is understood. Accordingly, it is possible to evaluate the in-plane temperature distribution in the mounting surface of the electrostatic chuck apparatus 31 easily and in real time.

Next, while the application of the voltage to the heater element 4 of the wafer for temperature measurement 1 is interrupted and the wafer for temperature measurement 1 is cooled by the cooling base section 33, the temperature of a plurality of temperature measurement regions 5 of the wafer for temperature measurement 1 are measured in order in real time using the thermograph 24.

As a result of the measuring using the thermograph 24, the cooling characteristics in the cooling process of the wafer 2 in the wafer for temperature measurement 1 are understood in real time. Accordingly, it is possible to evaluate the cooling characteristics in the cooling process of the mounting surface of the electrostatic chuck apparatus 31 easily and in real time.

As a result of evaluating the temperature rising characteristics in the temperature rising process and the cooling characteristics in the cooling process for the mounting surface of the electrostatic chuck apparatus 31 using the wafer for temperature measurement 1, it is possible to easily design an electrostatic chuck apparatus in a short amount of time.

According to the wafer for temperature measurement 1 of the present embodiment, since, together with bonding the insulating adhesive 3 to the entire surface of the surface 2a of the wafer 2 and providing the heater element 4 on the insulating adhesive 3, a plurality of temperature measurement regions 5 with a circular shape are provided at a predetermined location (a part) in a region excluding the heater element 4 and the heater element 4 and the temperature measurement regions 5 are covered with the insulating film 6, it is possible to evaluate the in-plane temperature distribution of the mounting surface of the electrostatic chuck apparatus and the cooling characteristics during decreases in temperature easily and in real time based on the measurement values of the surface temperature of the temperature measurement regions 5.

According to the temperature measuring apparatus 21 of the present embodiment, since the space 23 which stores the electrostatic chuck apparatus 31 which is mounted with the wafer for temperature measurement 1 is provided in a bottom section of the sealed container 22, the thermograph 24 is provided outside the ceiling plate of the sealed container 22 which faces the space 23, and the surface temperature of the electrostatic chuck apparatus 31 is measured using the thermograph 24 via the window 25 which is formed in the ceiling plate, it is possible to evaluate the in-plane temperature distribution of the mounting surface of the electrostatic chuck apparatus 31 and the cooling characteristics during decreases in temperature easily and in real time using the wafer for temperature measurement 1.

In this manner, since it is possible to easily measure the electrostatic chuck apparatus 31, use is also possible in shipping inspections or quality control of the electrostatic chuck apparatus.

Here, the temperature measuring apparatus 21 is provided with the thermograph 24 outside the ceiling plate of the sealed container 22 and configured to measure the surface temperature of the electrostatic chuck apparatus 31 using the thermograph 24 via the window 25 which is formed in the ceiling plate; however, it is possible to similarly evaluate the in-plane temperature distribution of the mounting surface of the electrostatic chuck apparatus 31 and the cooling characteristics during decreases in temperature easily and in real time using a non-contact type temperature measuring apparatus such as an optical thermometer or a radiation thermometer instead of the thermograph 24.

[Second Embodiment]

Figure 4:
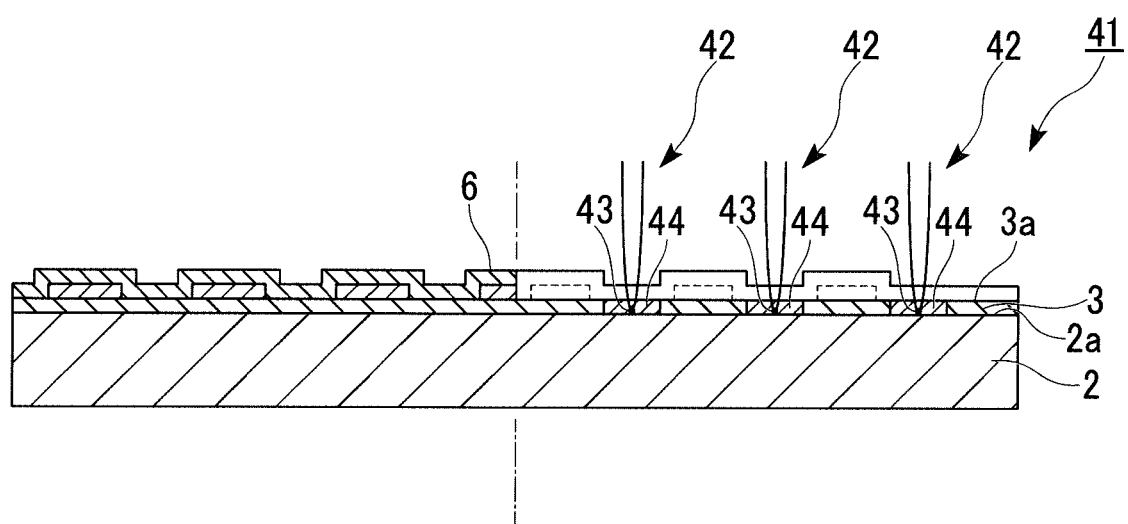
FIG. 4 is a cross-sectional view which shows a plate-shaped body for temperature measurement of a second embodiment of the present invention.

FIG. 4 is a cross-sectional view which shows a wafer for temperature measurement (plate-shaped body for temperature measurement) of a second embodiment of the present invention. The wafer for temperature measurement 41 of the present embodiment is different from the wafer for temperature measurement 1 of the first embodiment in the point that, while, in the wafer for temperature measurement 1 of the first embodiment, the temperature measurement regions 5 are provided in predetermined locations (a part) among the regions excluding the heater element 4 on the insulating adhesive 3 and the heater element 4 and the temperature measurement regions 5 are covered with the insulating film 6 where the infrared transmittance is 80% or less, in the wafer for temperature measurement 41 of the present embodiment, a plurality of portions which correspond to temperature measurement regions of the insulating adhesive 3 are removed, the surface 2a of the wafer 2 at these portions is exposed, hot junction sections 43 of a thermocouple 42 are bonded and fixed to the surface 2a of the exposed wafer 2, and each of these hot junction sections 43 is sealed with an adhesive 44 which has heat resistance and an insulating property.

In the wafer for temperature measurement 41, when a voltage is applied to the heater element 4 and the wafer for temperature measurement 41 is heated up to the target wafer temperature to be reached in the semiconductor manufacturing process, it is possible to evaluate the in-plane temperature distribution of the mounting surface of the electrostatic chuck apparatus easily and in real time by the temperatures of the surfaces 2a of each of the wafers 2 in a plurality of temperature measurement regions of the wafer for temperature measurement 41 being measured in order in real time using the thermocouple 42.

In addition, while the wafer for temperature measurement 41 is cooled by the cooling base section 33, by the temperatures of the surfaces 2a of each of the wafers 2 in a plurality of temperature measurement regions of the wafer for temperature measurement 41 being measured in order in real time using the thermocouple 42, it is possible to evaluate the cooling characteristics in the cooling process of the mounting surface of the electrostatic chuck apparatus easily and in real time.

Here, in the wafer for temperature measurement 41 of the present embodiment, the hot junction sections 43 of the thermocouple 42 are sealed with the adhesive 44 to the whole of each of the plurality of temperature measurement regions of the surface 2a of the exposed wafer 2; however, the thermocouple 42 need not be provided for the whole of each of the temperature measurement regions 5, and only the temperature measurement regions which are necessary in the surface 2a of the wafer 2 may be selected at a plurality of locations and exposed, and the hot junction sections 43 of the thermocouple 42 may be bonded and fixed to the surface 2a of the wafer 2 where these are exposed and then may be sealed with the adhesive 44.

INDUSTRIAL APPLICABILITY

The present invention is a plate-shaped body for temperature measurement and a temperature measuring apparatus provided with therewith, more specifically, it is possible to apply the present invention to a plate-shaped body for temperature measurement which is able to easily and in real time evaluate the in-plane temperature distribution of a mounting surface of an electrostatic chuck apparatus which is mounted with a plate-shaped sample such as a semiconductor wafer in a semiconductor manufacturing process, the temperature rising characteristics, and the cooling characteristics during decreases in temperature, and to a temperature measuring apparatus which is provided therewith.

REFERENCE SIGNS LIST

1 WAFER FOR TEMPERATURE MEASUREMENT (PLATE-SHAPED BODY FOR TEMPERATURE MEASUREMENT)
2 WAFER (PLATE-SHAPED BODY)
2A SURFACE (ONE MAIN SURFACE)

3 INSULATING ADHESIVE
4 HEATER ELEMENT (HEATING MEMBER)
5 TEMPERATURE MEASUREMENT REGION
6 INSULATING FILM
11, 12 VOLTAGE APPLICATION ELECTRODE
13 NOTCH
21 TEMPERATURE MEASURING APPARATUS
22 SEALED CONTAINER
23 SPACE
24 THERMOGRAPH
25 WINDOW
31 ELECTROSTATIC CHUCK APPARATUS
32 ELECTROSTATIC CHUCK
33 COOLING BASE SECTION
41 TEMPERATURE MEASUREMENT WAFER (PLATE-SHAPED BODY FOR TEMPERATURE MEASUREMENT)
42 THERMOCOUPLE
43 HOT JUNCTION SECTION
44 ADHESIVE

The invention claimed is:

1. A temperature measurement plate, comprising:
a wafer having an insulating adhesive on one main surface of the wafer;
a heating member on the insulating adhesive;
a plurality of temperature measurement regions provided on the insulating adhesive; and
an insulating film covering the heating member and the plurality of temperature measurement regions,
wherein the insulating adhesive includes any one type of an acrylic-based adhesive, and epoxy-based adhesive, and a polyimide amide-based adhesive,
the insulating film is formed of polytetrafluoroethylene, polyimide, or polyamide, and
the plurality of temperature measurement regions are arrayed in one row at predetermined intervals from each other and are connected with each other.

2. The temperature measurement plate according to claim 1, wherein the heating member is a metal foil.

3. The temperature measurement plate according to claim 1 or 2, wherein the wafer is formed of any one type of silicon, silicon carbide, silicon nitride, III-V group compound semiconductors, and II-VI group compound semiconductors.

4. The temperature measurement plate according to claim 2, wherein the metal foil is formed of titanium, tantalum, or molybdenum.

5. The temperature measurement plate according to claim 1, wherein the insulating adhesive is bonded to an entire surface of the wafer, and the heating member has a meandering shape.

6. The temperature measurement plate according to claim 5, wherein the plurality of the temperature measurement regions are connected with each other in one row between meandering portions of the meandering shape.

7. The temperature measurement plate according to claim 1, further comprising voltage application electrodes provided at opposite ends of the heating member.

8. The temperature measurement plate according to claim 1, wherein the plurality of temperature measurement regions are arrayed in a cross shape.

9. The temperature measurement plate according to claim 8, wherein the cross shape intersects at a center portion of the wafer.

10. The temperature measurement plate according to claim 1, wherein the insulating film has an infrared transmittance of 80% or less.

11. The temperature measurement plate according to claim 1, wherein each of the plurality of temperature measurement regions is a region with a circular shape having a diameter of 2 mm to 15 mm.

12. A temperature measuring apparatus comprising:
a temperature measurement plate comprising: a wafer having an insulating adhesive on one main surface of the wafer; a heating member on the insulating adhesive; a plurality of temperature measurement regions provided on the insulating adhesive; and an insulating film covering the heating member and the plurality of temperature measurement regions;
an electrostatic chuck apparatus comprising: an electrostatic chuck section having a mounting surface; and a cooling base section;
a thermograph; and
a sealed container compromising a ceiling plate having a window,
wherein the insulating adhesive includes any one type of an acrylic-based adhesive, an epoxy-based adhesive, and a polyimide amide-based adhesive,
the insulating film is formed of polytetrafluoroethylene, polyimide, or polyamide,
the wafer is configured to be mountable on the mounting surface such that the temperature measurement regions face the thermograph via the insulating film and to be removable from the mounting surface,
the electrostatic chuck apparatus is stored in a bottom section of the sealed container,
the thermograph is provided outside the ceiling plate and faces the electrostatic chuck apparatus via the window, and
the plurality of temperature measurement regions are arrayed in one row at predetermined intervals from each other and are connected with each other.

* * * * *